(12) United States Patent
Li et al.

(10) Patent No.: US 11,361,719 B2
(45) Date of Patent: Jun. 14, 2022

(54) BACKLIGHT MODULE, DISPLAY DEVICE AND MANUFACTURING METHOD THEREOF

(71) Applicants: BOE MLED Technology Co., Ltd., Beijing (CN); BOE Technology Group Co., Ltd., Beijing (CN)

(72) Inventors: Zhonghua Li, Beijing (CN); Shipeng Wang, Beijing (CN); Shaofei Guo, Beijing (CN); Yiping Ruan, Beijing (CN); Dongjia Hao, Beijing (CN); Chunying Qiao, Beijing (CN)

(73) Assignees: BOE MLED Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 59 days.

(21) Appl. No.: 16/833,861

(22) Filed: Mar. 30, 2020

(65) Prior Publication Data
US 2021/0097944 A1   Apr. 1, 2021

(30) Foreign Application Priority Data
Sep. 27, 2019   (CN) .......................... 201910922700.9

(51) Int. Cl.
G09G 3/34 (2006.01)
H05K 1/18 (2006.01)
H05K 5/02 (2006.01)
H05K 5/00 (2006.01)

(52) U.S. Cl.
CPC .......... G09G 3/3426 (2013.01); H05K 1/189 (2013.01); H05K 5/0017 (2013.01); H05K 5/0247 (2013.01)

(58) Field of Classification Search
CPC ......... G09G 3/3426; G09G 2300/0426; H05K 1/189; H05K 5/0247; H05K 5/0017; H05K 1/147; H05K 2201/10128; G02F 1/133608; G02F 1/133612; G02F 1/133603
See application file for complete search history.

(56) References Cited

U.S. PATENT DOCUMENTS

| | | | | |
|---|---|---|---|---|
| 8,223,291 | B2* | 7/2012 | Kim | G02F 1/133308 349/58 |
| 10,859,759 | B2* | 12/2020 | Isono | G02B 6/0088 |
| 2007/0290965 | A1* | 12/2007 | Shiraishi | G02F 1/13452 345/87 |
| 2010/0315324 | A1* | 12/2010 | Nam | H04N 13/354 345/102 |
| 2014/0028931 | A1* | 1/2014 | Tsurusaki | G06F 3/0445 349/12 |
| 2014/0169033 | A1* | 6/2014 | Yu | H05K 7/20409 362/611 |
| 2018/0356686 | A1* | 12/2018 | Yeh | G02F 1/133608 |
| 2018/0359856 | A1* | 12/2018 | Roh | G02F 1/1333 |
| 2019/0243187 | A1* | 8/2019 | Liu | G02F 1/133514 |
| 2019/0302529 | A1* | 10/2019 | Zha | G02F 1/133305 |

(Continued)

*Primary Examiner* — Grant Sitta
(74) *Attorney, Agent, or Firm* — ArentFox Schiff LLP; Michael Fainberg (57) ABSTRACT

Disclosed are a backlight module, a display device and a manufacturing method thereof. The backlight module includes: a frame, an LED lamp board, and an LED driver chip, where the LED chip is disposed on the border region of the lamp board body and disposed on a side of the lamp board body with the LED array arranged thereon.

11 Claims, 6 Drawing Sheets

(56) References Cited

U.S. PATENT DOCUMENTS

2020/0271280 A1\* 8/2020 Liu .................. G02F 1/133504
2021/0200033 A1\* 7/2021 Zhang ................. G02F 1/1336
2021/0240040 A1\* 8/2021 Li .......................... H01L 33/62

\* cited by examiner

| Providing the LED array and the LED driver chip respectively on the array region and the border region of the lamp board body, the LED array and the LED driver chip being located on the same side of the lamp board body | ~ 101 |

| Assembling the lamp board body in the frame, specifically in such a manner that the main body portion of the lamp board body is assembled in the receiving groove of the frame, and the connecting portion connected with one lateral side of the main body portion protrudes out of the receiving groove | ~ 102 |

| Bonding the display driver circuit board to the display panel | ~ 103 |

| Assembling the display panel to the frame so that the display driver circuit board is opposed to the connecting portion of the lamp board body, and connecting the display driver circuit board to the lamp board body | ~ 104 |

BACKLIGHT MODULE, DISPLAY DEVICE AND MANUFACTURING METHOD THEREOF

CROSS REFERENCE TO RELATED APPLICATION

This application claims priority to Chinese Patent Application No. 201910922700.9, filed with the Chinese Patent Office on Sep. 27, 2019. The entire disclosure of the above application is incorporated herein by reference.

FIELD

The present disclosure relates to the field of display technology, and in particular, to a backlight module, a display device and a manufacturing method thereof.

BACKGROUND

Mini LED refers to LEDs with a size of about 100 micrometers. As a technology, it sits sort-of halfway between traditional LED and Micro LED. Mini LED can be applied to a panel backlight, and can also be used for a display screen. Thus, its development has attracted much attention.

SUMMARY

The present disclosure discloses a backlight module, a display device and a manufacturing method thereof.

In a first aspect, an embodiment of the present disclosure provides a backlight module, including:

a frame having a bottom plate and a plurality of side plates, the bottom plate and the plurality of side plates enclosing a holding tank;

an LED lamp board, including a lamp board body and an LED array disposed on the lamp board body, wherein the lamp board body has a main body portion located in the holding tank of the frame, and a connecting portion located at one lateral side of the main body portion and protruding out of the holding tank; the connecting portion is configured to be connected to a display driver circuit board; the main body portion comprises an array region away from the connecting portion and a border region close to the connecting portion; and the LED array is arranged in the array region and disposed on a side of the lamp board body away from the bottom plate; and an LED driver chip, which is located in the border region of the lamp board body and disposed on a side of the lamp board body with the LED array disposed thereon.

In some embodiments, a side plate of the frame is provided with a first opening, and the connecting portion of the lamp board body protrudes out of the frame through the first opening.

In some embodiments, the lamp board body is a printed circuit board; and the backlight module further includes a reinforcing plate, which is disposed on a side of the lamp board body away from the LED driver chip, a projection of the LED driver chip on the lamp board body being located within a projection of the reinforcing plate on the lamp board body.

In some embodiments, the reinforcing plate is a steel plate or a Polyimide plate.

In some embodiments, the bottom plate of the frame is provided with a second opening to give way to the reinforcing plate, and the reinforcing plate is disposed in the second opening.

In some embodiments, the connecting portion of the lamp board body has an L-shaped structure, which includes a first extending portion and a second extending portion perpendicular to each other, the first extending portion being perpendicular to the side of the main body portion adjacent thereto.

In some embodiments, the backlight module includes at least two LED driver chips, and at least two connecting portions;

the LED driver chips are arranged in one-to-one correspondence with the connecting portions; and each LED driver chip is arranged at a position on the border region close to the connecting portion.

In a second aspect, an embodiment of the present disclosure further provides a display device, including the backlight module provided in the embodiment of the first aspect, and further comprising:

a display panel, which is arranged opposite to the main body portion of the lamp board body and has edges lap jointed with the side plates of the frame; and a display driver circuit board, which is arranged at a lateral side of the display panel, opposite to the connecting portion of the lamp board body, and is connected to the connecting portion of the lamp board body.

In some embodiments, the display device further includes:

a connector, which is arranged between the display driver circuit board and the connecting portion of the lamp board body, and the display driver circuit board and the connecting portion being connected through the connector.

In some embodiments, the display device further includes:

an independent electronic component, including at least one capacitor and/or at least one resistor, the independent electronic component being configured to cooperate with the LED driver chip to drive the LED array; and the capacitor and/or the resistor in the independent electronic component being arranged on the display driver circuit board and/or the border region of the lamp board body.

In a third aspect, an embodiment of the present disclosure provides a manufacturing method of the display device of the embodiment of the second aspect, comprising the following steps:

providing the LED array and the LED driver chip respectively on the array region and the border region of the lamp board body, the LED array and the LED driver chip being disposed on the same side of the lamp board body;

assembling the lamp board body in the frame;

bonding the display driver circuit board to the display panel; and assembling the display panel to the frame so that the display driver circuit board is opposed to the connecting portion of the lamp board body, and connecting the display driver circuit board to the lamp board body.

DETAILED DESCRIPTION OF THE EMBODIMENTS

At present, Mini LED display products, including mobile phones, tablets (TPCs), notebooks (NBs), etc., are still in the demo stage due to structural limitation of a chip drive solution, and there is no mature design solution. Using NB product demo as an example, a BLU (Backlight unit) driver board is used as a driver of Mini LED and occupies a large space, so it cannot meet the ultra-thin and narrow-border trend of products at present, and cannot be adapted to a subsequent mass production requirement.

Based on this, embodiments of the present disclosure provide a backlight module, a display device and a manufacturing method thereof. The technical solutions in the embodiments of the present disclosure will be described clearly and completely below in conjunction with the accompanying drawings in the embodiments of the present disclosure. Obviously, the described embodiments are only a part of the embodiments of the present disclosure, and not all the embodiments. Based on the embodiments in the present disclosure, all other embodiments obtained by those of ordinary skill in the art without inventive work shall fall into the protection scope of the present disclosure.

Figure 1:
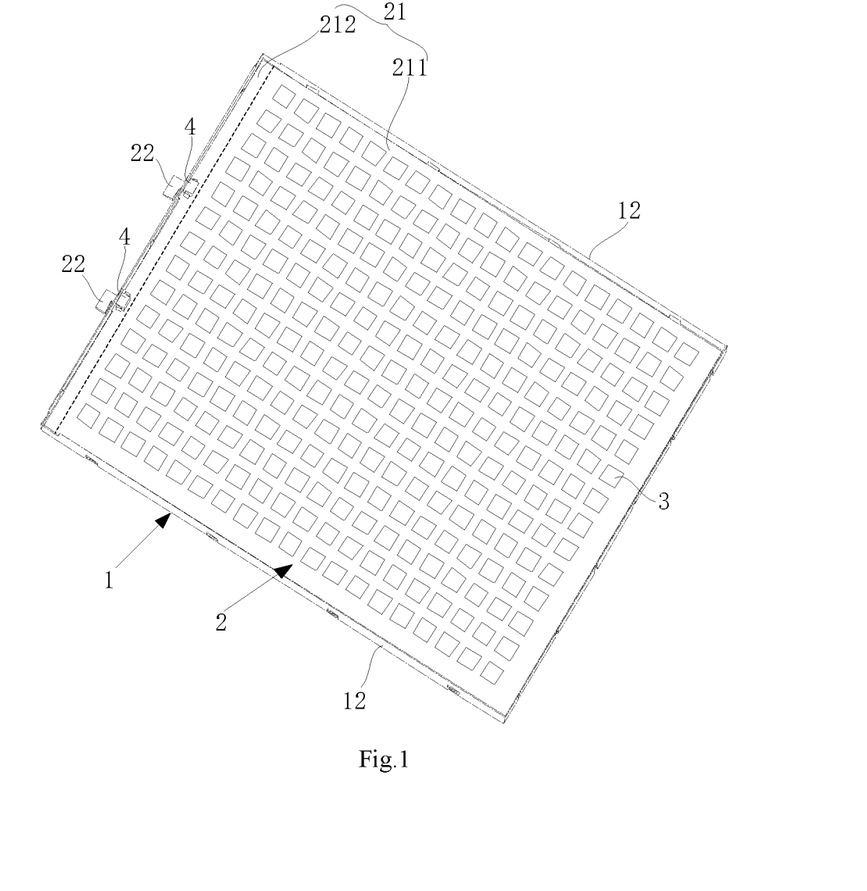
FIG. 1 is a schematic structural diagram of a backlight module from a side view provided in an embodiment of the present disclosure.
Figure 2:
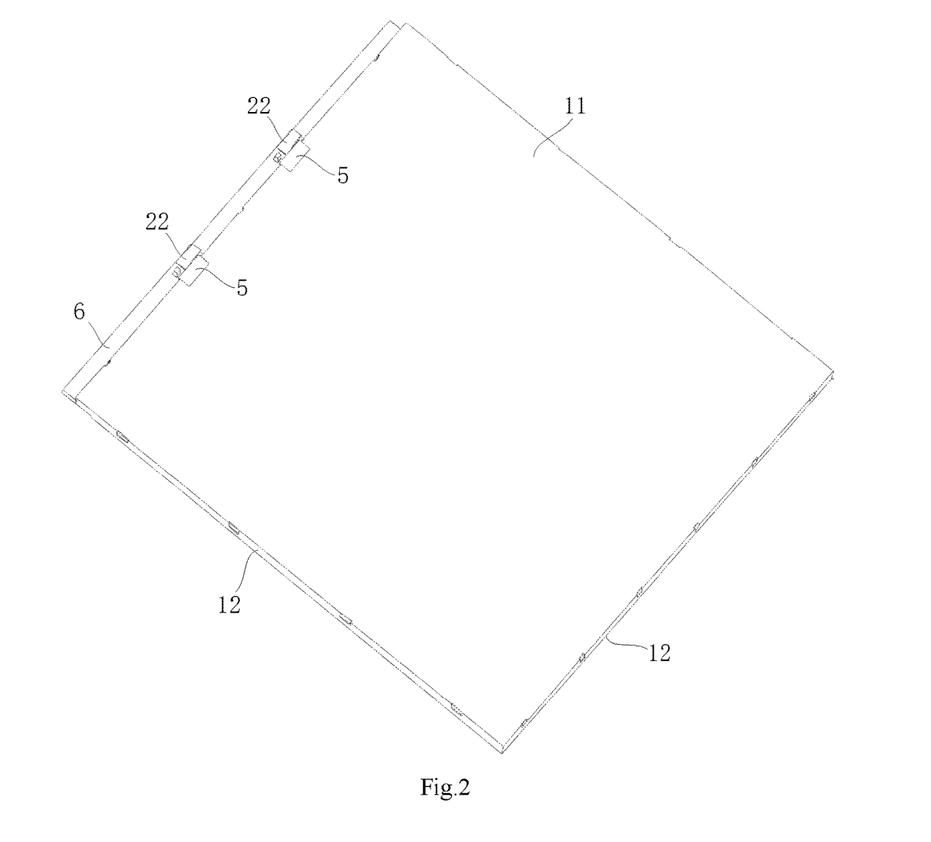
FIG. 2 is a schematic structural diagram of a backlight module and a display driver circuit board from another side view provided in an embodiment of the present disclosure.
Figure 3:
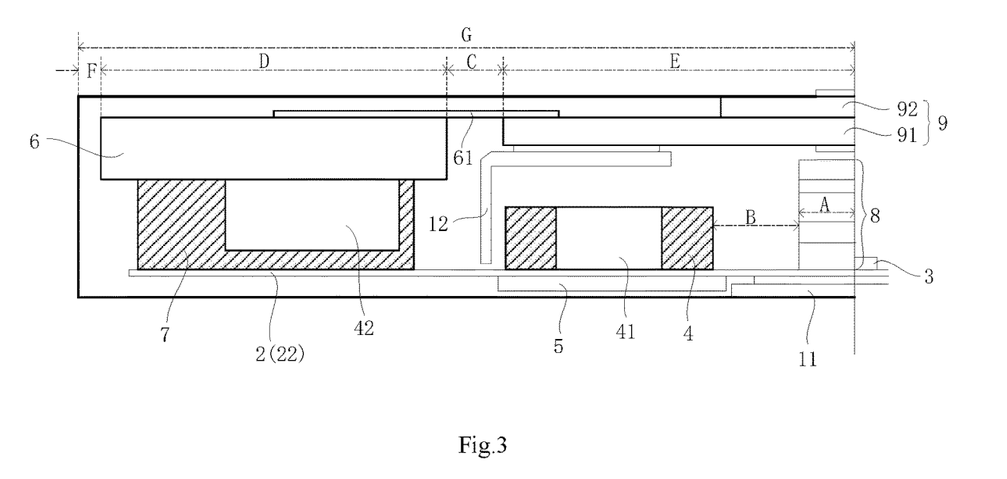
FIG. 3 is a cross-sectional view of a border, on a side where a display driver circuit board is arranged, of a display device provided in an embodiment of the present disclosure.

As shown in FIGS. 1 to 3, an embodiment of the present disclosure provides a backlight module, including:

a frame 1 having a bottom plate 11 and a plurality of side plates 12, with the bottom plate 11 and the plurality of side plates 12 forming a holding tank;

an LED lamp board, including a lamp board body 2 and an LED array arranged on the lamp board body 2, here the lamp board body 2 has a main body portion 21 located in the holding tank of the frame 1, and a connecting portion 22 located at one side of the main body portion 21 and protruding out of the holding tank; the connecting portion 22 is configured to be connected to a display driver circuit board 6; the main body portion 21 includes an array region 211 away from the connecting portion 22 and a border region 212 close to the connecting portion 22; and the LED array includes a plurality of LEDs 3 arranged in an array, and the LED array is located in the array region 211 and disposed on a side of the lamp board body 2 away from the bottom plate 11; and an LED driver chip 4, which is located in the border region 212 of the lamp board body 2 and disposed on a side of the lamp board body 2 with the LED array arranged.

The backlight module of the present disclosure is a direct-type surface light source using the LEDs 3. The backlight module uses a micro LED driver chip (driver IC) 4 to replace a large-sized backlight driver circuit board. Placing the driver IC 4 on the LED lamp board can reduce the border size of a backlight unit to achieve an ultra-narrow bezel of a display product, and it is more convenient for the driver IC 4 to drive the LED array through a signal. Furthermore, placing the driver IC 4 on the border region 212 located inside the frame 1 can avoid overlapping of the driver IC 4 and a display driver circuit board (display driver PCB) 6 located outside the frame 1, thereby preventing the arrangement space in a module thickness direction outside the frame 1 from being insufficient, reducing the size in the module thickness direction, and achieving a thin design requirement of the display product. In addition, placing the driver IC 4 on the side of the lamp board provided with LEDs 3 does not increase the thickness of the lamp board or change the contour of the lamp board, and can meet the module outline specification of a conventional product and achieve mass production of the LED display product. In summary, the aforementioned LED backlight module can achieve a narrow bezel of the display product, is adapted to ultra-thinness of the product, can achieve mass production, and can well meet the needs in the product market.

It should be noted that in the present disclosure, the LED being a mini LED and the LED array being a mini LED array are used as an example for description.

Figure 4:
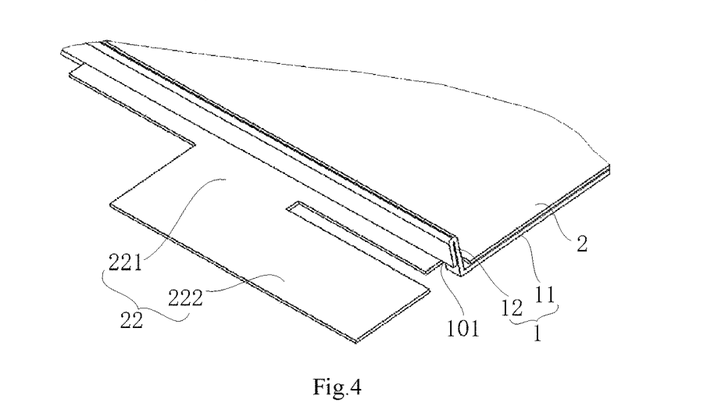
FIG. 4 is a partial structural diagram of a frame and a lamp board body in a backlight module provided in an embodiment of the present disclosure.

In some embodiments, as shown in FIG. 4, a side plate 12 of the frame 1 is provided with a first opening 101, and the connecting portion 22 of the lamp board body 2 protrudes out of the frame 1 through the first opening 101.

In some embodiments, as shown in FIG. 4, the connecting portion 22 of the lamp board body 2 has an L-shaped structure, which includes a first extending portion 221 and a second extending portion 222 perpendicular to each other, here the first extending portion 221 is perpendicular to the side of the main body portion 21 adjacent thereto.

Figure 6:
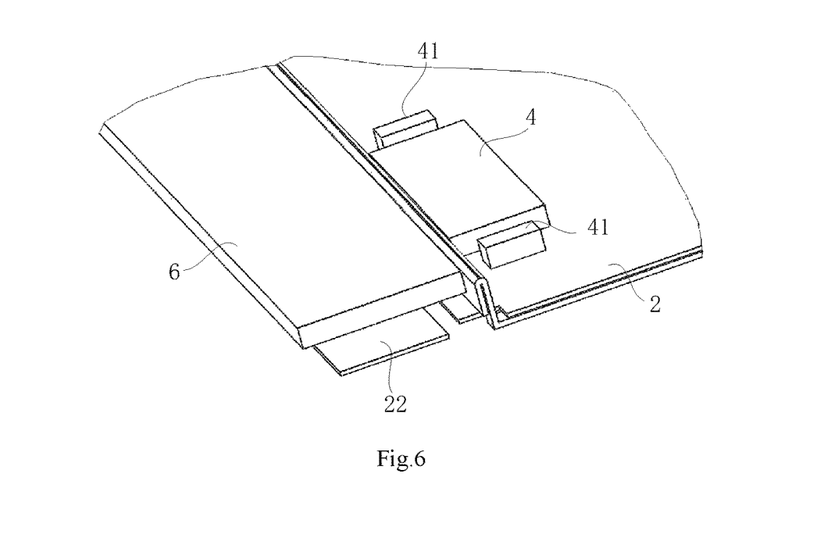
FIG. 6 is a schematic structural diagram of matched connection between the backlight module shown in FIG. 5 and a display driver circuit board.
Figure 7:
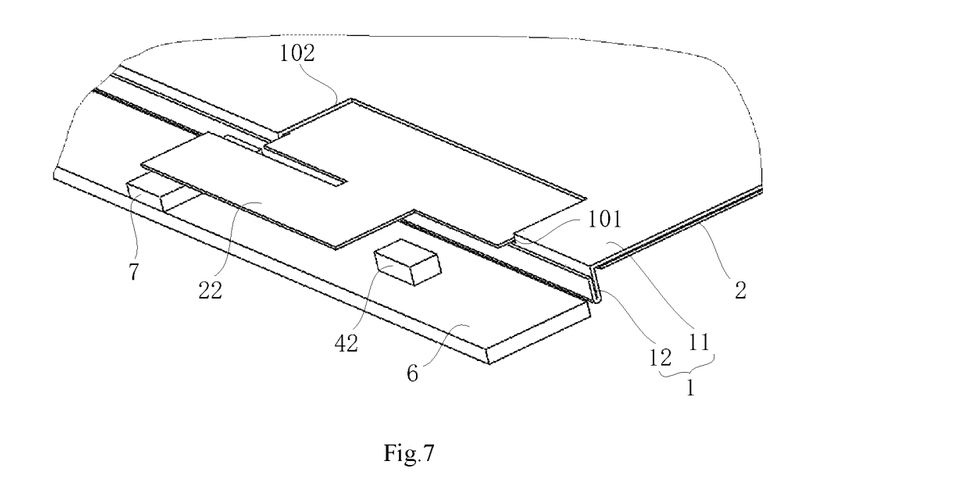
FIG. 7 is a schematic structural diagram of matched connection between the backlight module shown in FIG. 5 and a display driver circuit board through a connector.
Figure 8:
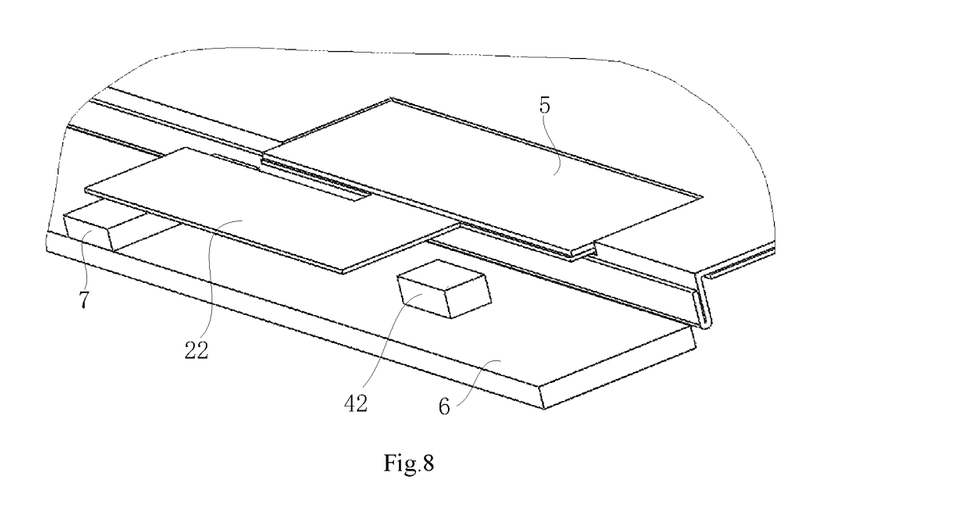
FIG. 8 is a schematic structural diagram of a frame opening of the backlight module shown in FIG. 7 with a reinforcing plate provided in the frame opening.

The protruding connecting portion 22 of the lamp board body 2 is designed to be L-shaped, to facilitate electrical connection with the display driver PCB 6 on the one hand, as shown in FIGS. 6 to 8, for example, the connecting portion 22 can be connected to the display driver PCB 6 through a connector 7, and the L-shaped connecting portion 22 can facilitate the plugging of the connector 7. On the other hand, the L-shaped connecting portion 22 can also prevent stress concentration, thereby improving the reliability of the connecting portion 22.

In some embodiments, as shown in FIG. 1, the backlight module provided in the embodiment of the present disclosure can include at least two LED driver chips (driver ICs) 4; and the LED array can be divided into a plurality of areas. Exemplarily, the backlight of each area is independently controlled, and each driver IC 4 is used for controlling the light emission of mini LEDs 3 in at least one of the plurality of areas, so that the contrast and brightness of an LCD screen, that is, the HDR (High-Dynamic Range) effect, can be improved, and the visual experience can be optimized. In some embodiments, display products that can use mini LEDs 3 as a backlight include mobile phones, tablets (TPCs), notebooks (NBs) and the like.

In some embodiments, as shown in FIG. 1, the backlight module includes at least two LED driver chips 4 and at least two connecting portions 22, where the connecting portions 22 are arranged in one-to-one correspondence with the LED driver chips 4; and each LED driver chip 4 is arranged at a position on the border region 212 close to the connecting portion 22, so that the wiring length from the LED driver chip 4 to the connecting portion 22 can be shortened, and the wiring arrangement on the LED lamp board is convenient.

Figure 5:
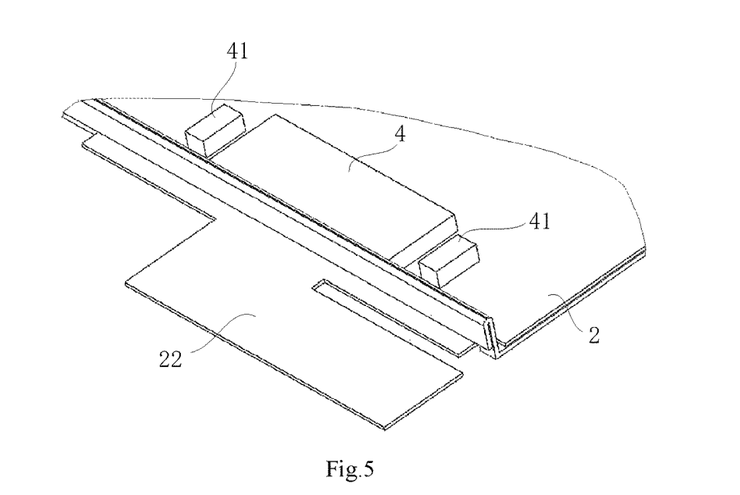
FIG. 5 is a schematic structural diagram of the lamp board body of the backlight module shown in FIG. 4 with an LED driver chip provided.

In some embodiments, as shown in FIGS. 1, 5 and 7, the lamp board body 2 is a printed circuit board, and in some embodiments can be a flexible circuit board (FPC). In some embodiments, the driver IC 4 is mounted on a die bonding side of the lamp board body 2 and placed inside the frame 1, and the frame 1 is hollowed at a position adjacent thereto to form the first opening 101, so that the connecting portion 22 protrudes out of the frame and is connected to the display driver PCB 6. Exemplarily, the frame 1 can be an iron frame.

In some embodiments, as shown in FIGS. 1 to 3 and FIG. 8, the backlight module further includes a reinforcing plate 5. The reinforcing plate 5 is disposed on a side of the lamp board body 2 away from the LED driver chip 4, and a projection of the LED driver chip 4 on the lamp board body 2 is located within a projection of the reinforcing plate 5 on the lamp board body 2. The reinforcement design directly below the position of the LED lamp board where the driver IC 4 is located can strengthen the protection of the LED lamp board.

In some embodiments, the reinforcing plate 5 can be a steel plate or a Polyimide (PI) plate.

In some embodiments, as shown in FIGS. 7 and 8, the bottom plate 11 of the frame 1 can be provided with a second opening 102 for giving way to the reinforcing plate 5, and the reinforcing plate 5 is located in the second opening 102. The second opening 102 provided on the bottom plate 11 to accommodate the reinforcing plate 5 can achieve close fit between the lamp board body 2 and the bottom plate 11, and also ensures the flatness of the lamp board body and the bottom plate 11 of the frame 1.

Of course, the lamp board body may also include a PCB, glass, or other carrier that can be used for circuit arrangement.

In some embodiments, as shown in FIGS. 1 and 3, the backlight module provided in the embodiment of the present disclosure further comprises an optical film 8 disposed inside the frame 1 and located on the array region 211 of the lamp board body 2. In the embodiment, an orthographic projection of a display area of a display device is located within an orthographic projection of the array region 211 of the lamp board body 2, and located within an orthographic projection of the optical film 8; that is, edge contours of the array region 211 and the optical film 8 both surround the display area.

Based on the same inventive concept, an embodiment of the present disclosure further provides a display device, as shown in FIG. 3, the display device including a backlight module described in any one of the foregoing implementations, and further including a display panel 9 and a display driver circuit board (display driver PCB) 6 provided at a side of the display panel 9. In some embodiments, the display panel 9 is arranged opposite to the main body portion of the lamp board body 2 and has edges lap jointed with the side plates 12 of the frame 1; and the display driver PCB 6 is arranged opposite to the connecting portion 22 of the lamp board body 2 protruding out of the frame 1 and is connected to the connecting portion 22; that is, a circuitry on the display driver PCB 6 is connected to a circuitry on the connecting portion 22.

In some embodiments, as shown in FIG. 3, the display panel is a liquid crystal display panel, which includes an array substrate 91 and a color filter substrate 92. The display driver PCB 6 is bonded and connected to a bonding area on an edge of the array substrate 91 through a flexible circuit board (FPC) 61, and is configured to control screen display of the display panel 9.

In some embodiments, as shown in FIGS. 3, 7 and 8, the display device provided in the present disclosure can further include a connector 7. The connector 7 is provided between the display driver PCB 6 and the connecting portion 22 of the lamp board body 2. The connecting portion 22 of the display driver PCB 6 and the lamp board body 2 are connected through the connector 7.

In some embodiments, the display device provided in the embodiment of the present disclosure can further include an independent electronic component. The independent electronic component includes at least one capacitor and/or at least one resistor, and is configured to cooperate with the LED driver chip 4 to drive the LED array.

In some embodiments, the driver IC 4 provided in the embodiment of the present disclosure can be a customized chip formed by integrating some functional circuits of the backlight driver circuit, and electric devices with a larger volume such as capacitors and/or resistors in the backlight driver circuit can be separated as independent electronic components to be arranged separately, so as to reduce the volume of the driver IC 4 and the space required to arrange the driver IC 4 as much as possible.

In some embodiments, electric devices such as capacitors and/or resistors of the independent electronic components can be disposed on the border region of the lamp board body 2 or on the display driver PCB 6; for example, as shown in FIGS. 3, 5 and 6, capacitors and/or resistors 41 with a smaller volume can be disposed on the border region of the lamp board body 2, and specifically can be located on two sides in an extending direction of each driver IC 4 along the border region 212, which does not increase the width of the border region; as shown in FIGS. 3, 7 and 8, a capacitor and/or resistor 42 with a larger volume can be disposed on the display driver PCB 6 and cooperates with the driver IC 4 on the lamp board body 2 through the connector 7; in this way, the space of the border region 212 of the lamp board body 2 can be designed very small, which is beneficial to the design of an ultra-narrow bezel.

As shown in FIGS. 3, and 5 to 8, in some embodiments, the backlight driver IC 4 is placed on a side of the lamp board body 2 with the mini LEDs 3 provided thereon, and the required small capacitors and/or resistors 41 are arranged around the driver IC 4, and the required large capacitor and/or resistor 42 is arranged on the display driver PCB 6. This design can reduce the border width of the LED lamp board, is beneficial to an ultra-narrow bezel of a display product, can meet the module outline specification of a conventional product and achieve mass production of a mini LED display product.

In some embodiments, using a notebook (NB) as an example, as shown in FIG. 3, for a border on a side where the display driver PCB 6 is arranged (a lower border of the NB), to achieve an ultra-narrow bezel, a distance A from an edge of the optical film 8 beyond an edge of the display area can be designed to be 1 mm (to meet a limit design value of optical effects), a distance B between the backlight driver IC 4 and an edge of the optical film 8 can be designed to be 1.5 mm (a safety distance to prevent the film from being deformed by heat), the size (length*width*height) of the driver IC 4 can be designed to be 10 mm*3.5 mm*0.8 mm, a distance C between an edge of the display panel 9 and the display driver PCB 6 can be designed to be 1.0 mm (to meet a limit value of a binding process), a width D of the display drive PCB 6 can be designed to be 6.0 mm (to meet a limit value of a device layout space), a border width E of the panel 9 can be designed to be 6.15 mm (a narrowest border for technology development), and a distance F from a module encapsulating edge (cell tape) to the display drive PCB 6 can be designed to be 0.4 mm. Other structures are conventionally designed. In this case, the width of the lower border G of the notebook (NB) product can reach C+D+E+F=13.55 mm. This border size meets the narrowest border design of NB products in the current market, while a module lower border of a conventional NB product is 16 mm-30 mm.

Of course, the foregoing embodiment only exemplifies a specific design of a display product (NB) provided in an embodiment of the present disclosure. In actual design, the distances between the parts of the NB display product can be larger than the values in the foregoing embodiment. Moreover, for other products, such as mobile phones and TPCs, the specific sizes need to be designed based on the actual products.

Figure 9:
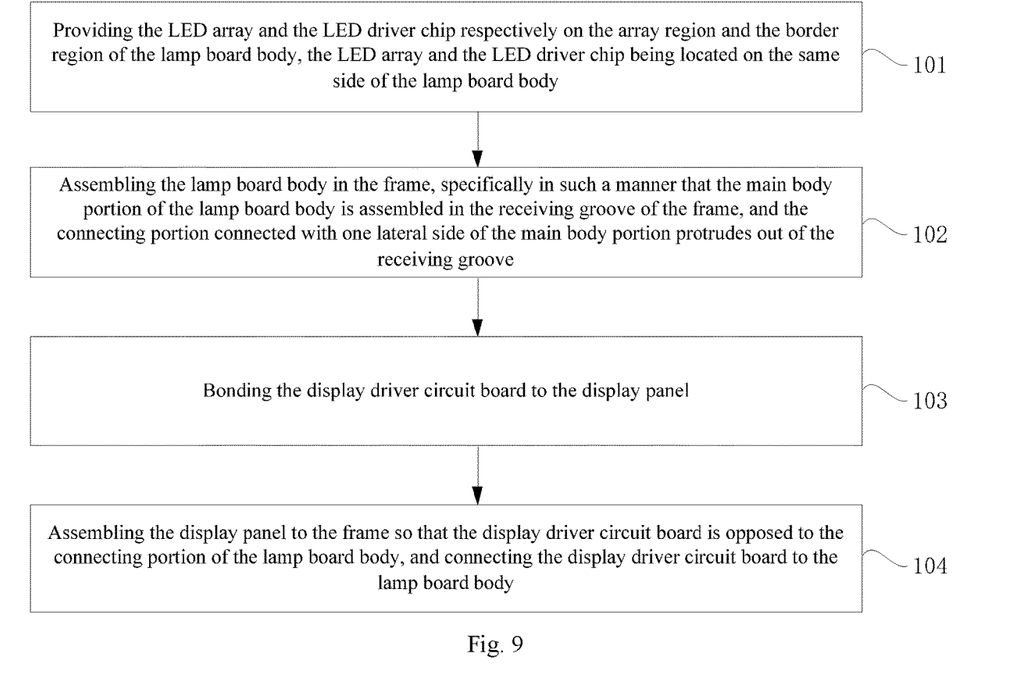
FIG. 9 is a flow diagram of a manufacturing method of a display device provided in an embodiment of the present disclosure.

Based on the same inventive concept, an embodiment of the present disclosure further provides a manufacturing method of the display device, as shown in FIG. 9, the method comprising the following steps.

Step 101, providing the LED array and the LED driver chip respectively on the array region and the border region of the lamp board body, the LED array and the LED driver chip being disposed on the same side of the lamp board body.

Step 102, assembling the lamp board body in the frame, where in some embodiments, the main body portion of the lamp board body is assembled in the holding tank of the frame, and the connecting portion connected with one side of the main body portion protrudes out of the holding tank.

Step 103, bonding the display driver circuit board to the display panel. In some embodiments, the display panel is a liquid crystal display panel including an array substrate and a color filter substrate, the display driver circuit board (display driver PCB) being bonded to a bonding area on an edge of the array substrate through a flexible circuit board (FPC).

Step 104, assembling the display panel to the frame so that the display driver circuit board is opposed to the connecting portion of the lamp board body, and electrically connecting the display driver circuit board to the lamp board body.

In some embodiments, the above steps 101 and 102 are a preparation process of the backlight module, and the above step 103 is a preparation process of the display panel. The two preparation processes can be performed simultaneously or sequentially. In some embodiments, step 103 may also be executed before step 101 or before step 102, and this can be determined according to actual needs.

Figure 10:
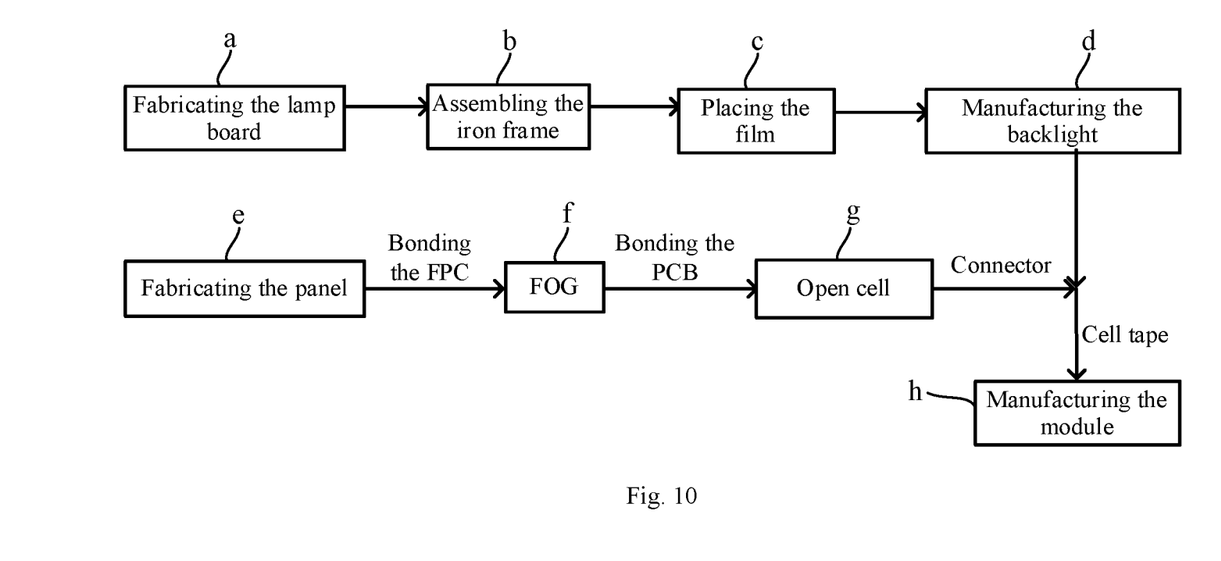
FIG. 10 is a schematic diagram of a manufacturing process of a display device provided in another embodiment of the present disclosure.

In some embodiments, as shown in FIG. 10, the manufacturing process of the backlight module can be summarized as follows: fabricating the lamp board (a), assembling the iron frame (b), and assembling the film (c), and accomplishing manufacture of the backlight module (d); the manufacturing process of the display panel can be summarized as follows: fabricating the panel (e), bonding the FPC to form an FOG module (f), and bonding the PCB to form a panel module (open cell) (g); and then the panel module and the backlight module are assembled together, the connecting portion at a protruding end of the LED lamp board is connected to the PCB through the connector, and finally edges of the assembled module are taped (cell tape), to complete the manufacturing process of the display module (h).

In some embodiments, in step 101, in the backlight preparation process, the driver IC and the mini LED chip are mounted on the same side of the LED lamp board. Two mounting processes use different equipment, here a die bonding machine is used for the mini LED chip, and a surface mount technology (SMT) machine is used for the driver IC. If the same mounting factory has both a die bonding machine and a placement machine, and a stencil is applied with a solder paste at two parts at the same time, the SMT is directly performed after the die-bonding. Such a technical process is most simplified. If the two types of equipment are not present at the same mounting factory, to simplify the technical process, it can be performed in the order of fabricating the lamp board body first, then mounting the driving IC, and die-bonding the mini LED chip.

Evidently those skilled in the art can make various modifications and variations to the embodiments of the present disclosure without departing from the spirit and scope of the present disclosure. Thus the present disclosure is also intended to encompass these modifications and variations thereto so long as the modifications and variations come into the scope of the claims appended to the application and their equivalents.

The invention claimed is:

1. A backlight module, comprising:
   a frame having a bottom plate and a plurality of side plates, the bottom plate and the plurality of side plates forming a holding tank;
   an LED lamp board, comprising a lamp board body and an LED array disposed on the lamp board body, wherein the lamp board body has a main body portion located in the holding tank of the frame, and a connecting portion located at one lateral side of the main body portion and protruding out of the holding tank; the connecting portion is configured to be connected to a display driver circuit board; the main body portion comprises an array region away from the connecting portion and a border region close to the connecting portion; and the LED array is arranged in the array region and disposed on a side of the lamp board body away from the bottom plate; and
   an LED driver chip, which is located in the border region of the lamp board body and disposed on a side of the lamp board body with the LED array disposed thereon;
   wherein a side plate of the frame is provided with a first opening, and the connecting portion of the lamp board body protrudes out of the frame through the first opening.

2. The backlight module according to claim 1, wherein the lamp board body is a printed circuit board; and
   the backlight module further comprises a reinforcing plate, which is disposed on a side of the lamp board body away from the LED driver chip, a projection of the LED driver chip on the lamp board body being located within a projection of the reinforcing plate on the lamp board body.

3. The backlight module according to claim 2, wherein the reinforcing plate is a steel plate or a Polyimide plate.

4. The backlight module according to claim 2, wherein the bottom plate of the frame is provided with a second opening to give way to the reinforcing plate, and the reinforcing plate is disposed in the second opening.

5. The backlight module according to claim 1, wherein the connecting portion of the lamp board body has an L-shaped structure, which comprises a first extending portion and a second extending portion perpendicular to each other, the first extending portion being perpendicular to a side of the main body portion adjacent thereto.

6. The backlight module according to claim 5, comprising at least two LED driver chips, and at least two connecting portions;

the LED driver chips are arranged in one-to-one correspondence with the connecting portions; and each LED driver chip is arranged at a position on the border region close to the connecting portion.

7. A display device, comprising the backlight module of claim 1, and further comprising:

a display panel, which is arranged opposite to the main body portion of the lamp board body and has edges lap-jointed with the side plates of the frame; and a display driver circuit board, which is arranged at a side of the display panel, opposite to the connecting portion of the lamp board body, and is connected to the connecting portion of the lamp board body.

8. The display device according to claim 7, wherein the display device further comprises:

a connector, which is arranged between the display driver circuit board and the connecting portion of the lamp board body, and the display driver circuit board and the connecting portion being connected through the connector.

9. The display device according to claim 7, further comprising:

an independent electronic component, comprising at least one capacitor and/or at least one resistor, the independent electronic component being configured to cooperate with the LED driver chip to drive the LED array; and the capacitor and/or the resistor in the independent electronic component being arranged on the display driver circuit board and/or the border region of the lamp board body.

10. The display device according to claim 8, further comprising:

an independent electronic component, comprising at least one capacitor and/or at least one resistor, the independent electronic component being configured to cooperate with the LED driver chip to drive the LED array; and the capacitor and/or the resistor in the independent electronic component being arranged on the display driver circuit board and/or the border region of the lamp board body.

11. A manufacturing method of the display device of claim 7, comprising:

providing the LED array and the LED driver chip respectively on the array region and the border region of the lamp board body, the LED array and the LED driver chip being disposed on a same side of the lamp board body;

assembling the lamp board body in the frame;

bonding the display driver circuit board to the display panel;

assembling the display panel to the frame so that the display driver circuit board is opposed to the connecting portion of the lamp board body, and connecting the display driver circuit board to the lamp board body.

* * * * *